United States Patent [19]

Kawaura et al.

[11] 4,426,595
[45] Jan. 17, 1984

[54] ACOUSTIC SURFACE WAVE DEVICE WITH IMPROVED BAND-PASS CHARACTERISTICS

[75] Inventors: Kuninori Kawaura, Suzaka; Sumio Yamada, Kawasaki; Noboru Wakatsuki, Kawasaki; Masaaki Ono, Kawasaki; Shigeo Tanji, Yokohama; Yoshiro Fujiwara, Kawasaki; Masanobu Yanagisawa, Yokohama, all of Japan.

[73] Assignee: Fujitsu Limited, Kawasaki, Japan

[21] Appl. No.: 341,683

[22] Filed: Jan. 22, 1982

[30] Foreign Application Priority Data

Jan. 30, 1981 [JP] Japan ............................ 56-12536

[51] Int. Cl.³ ............................ H01L 41/10
[52] U.S. Cl. ............................ 310/313 D; 310/313 R; 333/151; 333/194
[58] Field of Search ............................ 310/313 A–313 D, 310/313 R; 333/151, 154, 193, 194, 195

[56] References Cited

U.S. PATENT DOCUMENTS

| 4,139,791 | 2/1979 | Yamada et al. | 310/313 C |
| 4,146,851 | 3/1979 | Dempsey et al. | 333/194 |
| 4,188,596 | 2/1980 | Miura . | |
| 4,350,963 | 9/1982 | Iwamoto et al. | 333/151 |

FOREIGN PATENT DOCUMENTS

| 2363230 | 3/1978 | France | 310/313 C |
| 2395643 | 1/1979 | France | 333/194 |
| 56-80912 | 2/1981 | Japan | 333/195 |

Primary Examiner—J. D. Miller
Assistant Examiner—D. L. Rebsch
Attorney, Agent, or Firm—Staas & Halsey

[57] ABSTRACT

An acoustic surface wave device comprises a piezoelectric substrate (1), an input transducer (2), an output transducer (3) and acoustical absorbent layer patterns (5, 6) for absorbing undesired acoustic surface waves and bulk waves ($S_4$, $S_5$). Each of the acoustical absorbent layer patterns (5, 6) has zigzag-shaped or triangular shaped edges, i.e., a recess portion ($R_1$, $R_3$) and a protruding portion ($R_2$, $R_4$). The recess portion has a further recess portion ($R_1'$, $R_3'$) which is formed diagonally with respect to the propagation path of acoustic surface waves.

11 Claims, 8 Drawing Figures

ACOUSTIC SURFACE WAVE DEVICE WITH IMPROVED BAND-PASS CHARACTERISTICS

BACKGROUND OF THE INVENTION

The present invention relates to an acoustic surface wave device which serves as a band-pass filter, a resonator, a delay line or the like.

In general, conversion of acoustic surface waves propagating across a piezoelectric substrate to electrical energy and vice versa is carried out by a transducer which is conventionally composed of a pair of separated, interdigitated comb-shaped electrodes or a pair of separated, venetian blind shaped electrodes formed on the surface of the piezoelectric substrate.

One conventional acoustic surface wave device comprises: a piezoelectric substrate made of lithium niobate (LiNbO$_3$), lithium tantalate (LiTaO$_3$) or the like, having a plane surface for the propagation of acoustic surfaces waves; and input and output transducers formed on the surface of the substrate. When an electrical signal is applied to the input transducer, the electrical signal is converted into acoustic surfaces waves which are propagated to the output transducer. As a result, the acoustic surface waves are reconverted into other types of electrical signals by the output transducer. In this case, several kinds of waves are generated, as follows:

(a) desired acoustic surface waves which are launched by the input transducer and are propagated on the surface of the substrate to reach the output transducer;

(b) undesired bulk waves which are launched by the input transducer and are propagated through the body of the substrate to reach the output transducer;

(c) undesired surface wave reflections which are launched by the input transducer and are reflected by the output transducer and, in addition, are reflected by the input transducer to reach the output transducer;

(d) undesired surface wave reflections and bulk waves which are launched by the input transducer and reflected by the end face of the substrate to return to the input transducer and, in addition, to reach the output transducer; and (e) undesired surface reflections and bulk waves which are launched by the output transducer and are reflected by the end surface of the substrate to return to the output transducer.

In particular, the reflections explained in item (c) are called triple transit echos (hereinafter referred to as TTEs), since the reflections travel three times between the input and output transducers. The undesired surface wave reflections and bulk waves explained in items (b) through (e), above, deteriorate the band-pass (filter) characteristics, since their transit times are different from that of the desired acoustic surface waves explained in item (a).

In order to reduce undesired bulk waves and TTEs, explained in items (b) and (c), above, respectively, a multistrip coupler (hereinafter referred to as an MSC), which is composed of a plurality of parallel and equally spaced conductors, is conventionally formed on the surface of the substrate and interposed between the input and output transducers. In this case, the input and output transducers are located diagonally with respect to each other. The MSC transfers the propagation path of acoustic surface waves from one track to another track. In other words, the MSC serves as a path changer only for acoustic surface waves, not for bulk waves which travel through the body of the substrate. Therefore, bulk waves do not reach the output transducer. Note that the MSC can also reduce the TTEs explained in item (c), above.

On the other hand, in order to reduce undesired surface wave reflections and bulk waves, explained in items (d) and (e), above, acoustical absorbent layer patterns made of oleoresin or urearesin are conventionally formed on the substrate behind the input and output transducers. The acoustical absorbent layer patterns absorb most acoustic surface waves and bulk waves, but reflect some of the acoustic surface waves and bulk waves. In this case, the acoustic absorbent layer patterns have zigzag-shaped edges facing the input or output transducer so as to change the reflection path direction of the undesired waves, thereby preventing the undesired waves from being propagated into the input or output transducer.

In this case, however, since the acoustical absorbent layer patterns are conventionally coated by the screen print method the patterns sometimes spread due to the change in viscosity. As a result, the tip of each recess portion of the acoustical absorbent layer patterns becomes rounded with the result that it becomes parallel to the wave front of the acoustic surface waves. Therefore, the reflections from the tip of each recess portion return to the input or output transducer, which causes the problem of degration in the band-pass characteristics.

SUMMARY OF THE INVENTION

It is, therefore, an object of the present invention to provide an acoustic surface wave device with good band-pass characteristics.

According to the present invention, there is provided an acoustic surface wave device comprising: a piezoelectric substrate having a plane surface for propagation of acoustic surface waves; an input transducer formed on the surface of the piezoelectric substrate, for converting electrical energy into acoustic surface waves; an output transducer formed on the surface of the piezoelectric substrate, for converting the acoustic surface waves into another type of electrical energy; acoustical absorbent layer patterns of a triangular configuration having at least one V-shaped recess portion and at least one V-shaped protruding portion, formed on the surface of the piezoelectric substrate behind the input and output transducers. Each V-shaped recess portion of the triangular configuration acoustical absorbent layer patterns has a further recess portion which is formed diagonally with respect to the propagation path of the acoustic surface waves.

BRIEF DESCRIPTION OF THE DRAWINGS

The present invention will be more clearly understood from the description, as set forth below, contrasting the present invention with the conventional devices and with reference to the accompanying drawings, wherein.

DETAILED DESCRIPTION OF THE PREFERRED EMBODIMENTS

Figure 1:
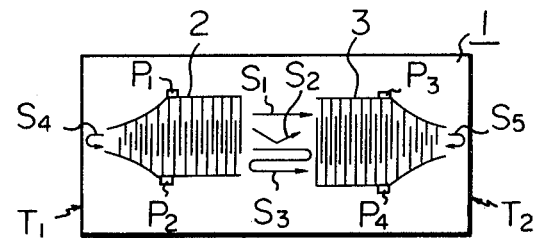
FIG. 1 is a plan view of one conventional acoustic surface wave device.

In FIG. 1, which illustrates one conventional acoustic surface wave device, 1 is a piezoelectric substrate which is made of lithium niobate ($LiNbO_3$) or lithium tantalate ($LiTaO_3$) and is approximately 300 to 500 $\mu$m thick. An input transducer 2 and an output transducer 3, each of which comprises a part of separated, interdigitated comb-shaped electrodes, are formed on the plane surface of the substrate 1. In this case, the transducers 2 and 3 are made of, for example, aluminium which is about 1000 to 5000 Å thick. In the device of FIG. 1, when an electrical signal is applied to the two electrodes of the input transducer 2 via pads $P_1$ and $P_2$, the electrical signal is converted into acoustic surface waves $S_1$ which are reconverted into other types of electrical signals by the output transducer 3. Such electrical signals are obtained at pads $P_3$ and $P_4$. Thus, the device of FIG. 1 serves as a band-pass filter, a resonator or a delay line.

In the device of FIG. 1, however, there are generated several kinds of undesired waves, other than the desired acoustic surface waves $S_1$. Thus, $S_2$ indicates undesired bulk waves which are launched by the input transducer 2 and are propagated through the body of the substrate 1 to reach the output transducer 3; $S_3$ indicates undesired TTEs which are launched by the input transducer 2 and are reflected by the output transducer 3 and, in addition, are reflected by the input transducer 2 to reach the output transducer 3; $S_4$ indicates undesired surface wave reflections and bulks waves which are launched by the input transducer 2 and are reflected by an end face $T_1$ of the substrate 1 to return to the input transducer 2; and $S_5$ indicates undesired surface wave reflections and bulk waves which are launched by the output transducer 3 and are reflected by another end face $T_2$ of the substrate 1 to return to the output transducer 3. All the waves $S_2$, $S_3$, $S_4$ and $S_5$ deteriorate the band-pass characteristics, since their transit times are different from that of the desired acoustic surface waves $S_1$.

Figure 2:
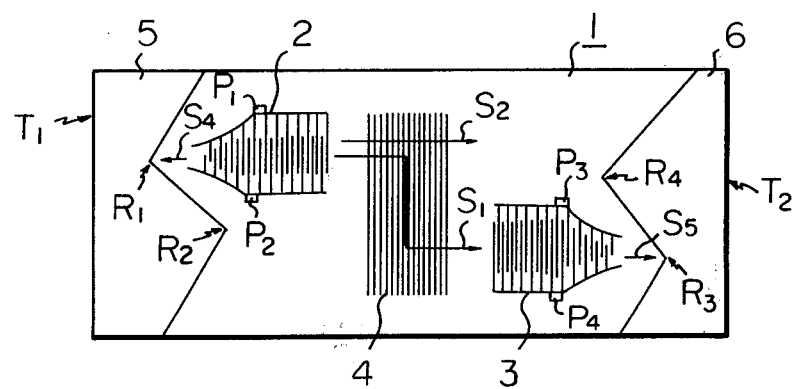
FIG. 2 is a plan view of another conventional acoustic surface wave device.

FIG. 2 is a plan view illustrating another conventional acoustic surface wave device. In FIG. 2, an MSC 4, which is composed of a plurality of parallel and equally spaced conductors, and acoustical absorbent layer patterns 5 and 6 are added to FIG. 1. In this case, the input transducer 2 is located diagonally with respect to the output transducer 3.

In FIG. 2, the MSC 4 converts acoustic surface waves from the input transducer 2 into electrical energy and reconverts the electrical energy into other types of acoustic surface waves. That is, the MSC 4 serves as a path changer for the desired acoustic surface waves $S_1$, not for the undesired bulk waves $S_2$. Therefore, the bulk waves $S_2$ do not reach the output transducer 3. In addition, the TTEs $S_3$ (not shown in FIG. 2, but in FIG. 1) are suppressed by the MSC 4.

Figure 3A:
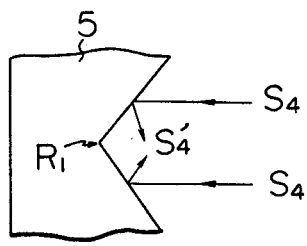
FIG. 3A is an enlarged view of a recess portion R$_1$ of FIG. 2.

On the other hand, the acoustical absorbent layer patterns 5 and 6 are formed by coating oleoresin or urearesin by using the screen print method. For example, the acoustical absorbent layer patterns 5 and 6 are about 15 to 20 $\mu$m thick. The acoustical absorbent layer patterns 5 and 6 have zigzag-shaped or triangular edges facing the input transducer 2 and the output transducer 3. In other words, for example, the acoustical absorbent layer pattern 5 has a V-shaped recess portion $R_1$ and a V-shaped protruding portion $R_2$. As a result, the acoustical absorbent layer pattern 5 absorbs most of the undesired waves $S_4$ from the input transducer 2 and, simultaneously, reflects some of the undesired waves $S_4$. However, in this case, the acoustical absorbent layer pattern 5 changes the direction of the reflections $S_4'$ of the waves $S_4$, as illustrated in FIG. 3A which is an enlarged view of the recess portion $R_1$ of FIG. 2. Similarly, the acoustical absorbent layer pattern 6 has a V-shaped recess portion $R_3$ and a V-shaped protruding portion $R_4$. As a result, the acoustical absorbent layer pattern 6 absorbs most of the undesired waves $S_5$ and, simultaneously, reflects some of the undesired waves $S_5$. However, the direction of the reflections of the undesired waves $S_5$ is also changed. Therefore, such reflections do not return to the input transducer 2 or to the output transducer 3.

Figure 3B:
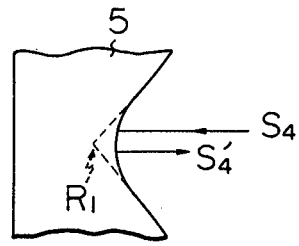
FIG. 3B is a modification of FIG. 3A.

In the device of FIG. 2, however, the acoustical absorbent layer patterns 5 and 6 sometimes spread during the manufacture thereof due to a change of viscosity. Therefore, as illustrated in FIG. 3B, the tip of the V-shaped recess portion $R_1$ of the acoustical absorbent layer pattern 5 becomes rounded, with the result that it becomes parallel to the wave front of the waves $S_4$. As a result, the reflections $S_4'$ return to the input transducer 2, which causes the problem of degradation of the band-pass characteristics.

Figure 4:
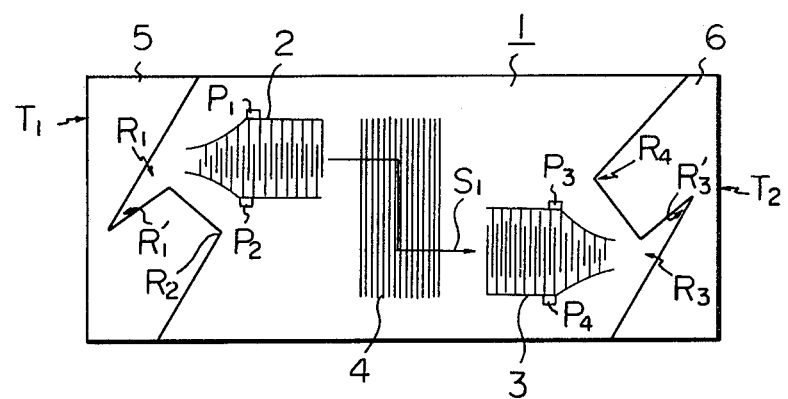
FIG. 4 is a plan view of one embodiment of the acoustic surface wave device according to the present invention.

FIG. 4 is a plan view illustrating one embodiment of the acoustic surface device according to the present invention. In FIG. 4, a further recess portion $R_1'$ (or $R_3'$) is provided in the V-shaped recess portion $R_1$ (or $R_3$). In this case, the recess portion $R_1'$ is formed diagonally with respect to the propagation path of the acoustic surface waves.

Figure 5A:
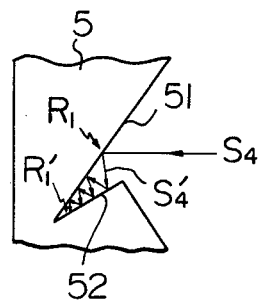
FIGS. 5A and 5B are enlarged view of recess portion $R_1$ of FIG. 4.

As illustrated in FIG. 5A, which is an enlarged view of the V-shaped recess portion $R_1$ of FIG. 4, most of the waves $S_4$ from the input transducer 2 are absorbed by the acoustical absorbent layer pattern 5; however, reflections $S_4'$ which correspond to some of the waves $S_4$ are reflected by the edge 51 of the acoustical absorbent layer pattern 5. Some of the reflections $S_4'$ are again reflected by the edge 52 of the acoustical absorbent layer pattern 5. This phenomenon is repeated so that the reflections $S_4'$ are attenuated and absorbed.

Figure 5B:
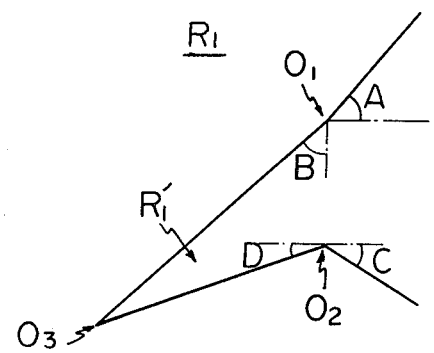

FIG. 5B is also an enlargement of the V-shaped recess portion $R_1$ of FIG. 4. As illustrated in FIG. 5B, for example, the recess portion $R_1'$ should be formed so as to satisfy the following conditions:

$$0 < A < 90°$$

$$0 < B < 90° - D$$

$$10° < C < 80°$$

$$20° < D < 90°$$

In other words, the position of the tip $O_3$ is on the outer side of the tip $O_2$. Of course, the position of the tip $O_3$ can be on the outer side of the tip $O_1$.

It should be noted that, even when the recess portions $R_1'$ and $R_3'$ become rounded due to the change of viscosity, the acoustical absorbent layer patterns 5 and 6 of FIG. 4 can absorb the undesired waves $S_4$ and $S_5$, respectively.

Figure 6:
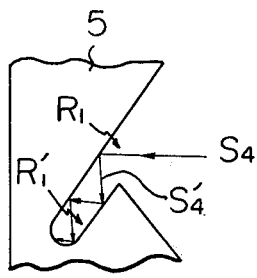
FIG. 6 is a modification of FIG. 5A.

FIG. 6 is a modification of FIG. 5A. In FIG. 5A, the recess portion $R_1'$ is V-shaped, while, in FIG. 6, the recess portion $R_1'$ is U-shaped. In this case, the same effect can also be expected.

Using black urearesin as the acoustical absorbent material, the inventors compared the attentuation of the reflections to the acoustic surface waves at a frequency of 38.9 MHz. In the conventional device of FIG. 2, the attenuation was $-36$ dB to $-42$ dB (average $-39$ dB), while, in the device of FIG. 4 according to the present invention, the attenuation was $-43$ dB to $-47$ dB (average $-45$ dB).

As explained hereinbefore, the acoustic surface wave device according to the present invention has advantages, as compared with the conventional device of FIG. 2, in that the band-pass characteristics are improved, since the acoustical absorbent layer patterns 5 and 6 absorb undesired waves efficiently, regardless of the change of viscosity during the manufacture thereof.

We claim:

1. An acoustic surface wave device comprising:
    a piezoelectric substrate having a plane surface for propagation of acoustic surface waves along a propagation path;
    an input transducer formed on the surface of said piezoelectric substrate, for converting electrical energy into said acoustic surface waves;
    an output transducer formed on the surface of said piezoelectric substrate, for converting said acoustic surface waves into another type of electrical energy; and
    acoustical absorbent layer patterns of a triangular configuration having at least one V-shaped recess portion and at least one V-shaped protruding portion, formed on the surface of said piezoelectric substrate behind said input and output transducers, respectively;
    each said V-shaped recess portion, of said acoustical absorbent layer patterns of a triangular configuration, having a further recess portion whose line of symmetry is formed diagonally with respect to the propagation path of said acoustic surface waves.

2. An acoustic surface wave device as set forth in claim 1, further comprising a multistrip coupler including a plurality of parallel and equally spaced conductors, formed on the surface of said piezoelectric substrate and interposed between said input and output transducers, for changing the propagation path of said acoustic surface waves, said input and output transducers being located diagonally with respect to each other.

3. An acoustic surface wave device as set forth in claim 1, wherein said further recess portion is V-shaped.

4. An acoustic surface wave device as set forth in claim 1, wherein said further recess portion is U-shaped.

5. An acoustic surface wave device as set forth in claim 1, wherein said acoustical absorbent layer patterns are made of oleoresin.

6. An acoustic surface wave device as set forth in claim 1, wherein said acoustical absorbent layer patterns are made of urearesin.

7. An acoustic surface wave device as set forth in claim 1, wherein each of said input and output transducers comprises a pair of separated, interdigitated comb-shaped electrodes.

8. An acoustic surface wave device as set forth in claim 1, wherein each of said input and output transducers comprises a pair of separated, venetian blind shaped electrodes.

9. An acoustic surface wave device for receiving a first type of electrical energy, comprising:
    a piezoelectric substrate having a plane surface for propagation of acoustic surface waves along a propagation path;
    an input transducer formed on the surface of said piezoelectric substrate, for converting said first type of electrical energy into said acoustic surface waves, said input transducer having a first end;
    an output transducer formed on the surface of said piezoelectric substrate, for converting said acoustic surface waves into a second type of electrical energy; and
    an acoustical absorbent layer pattern formed on the surface of said piezoelectric substrate adjacent the first end of said input transducer, said acoustical absorbent layer pattern having an irregular edge including a first recess portion adjacent the first end of said input transducer, said first recess portion having an internal recess portion whose line of symmetry is formed at a diagonal with respect to the propagation path of said acoustic surface waves, said internal recess portion for trapping any of said acoustic surface waves which propagate into said internal recess portion.

10. An acoustic surface wave device as set forth in claim 9,
    wherein said first recess portion has an edge which is defined by first and second segments each of which has an end,
    wherein said internal recess has an edge which is defined by third and fourth segments each of which has first and second ends,
    wherein said first end of said third segment is connected to the end of said first segment,
    wherein said first end of said fourth segment is connected to the second end of said third segment, and
    wherein said second end of said fourth segment is connected to said end of said second segment.

11. An acoustic surface wave device as set forth in claim 10,
    wherein said first segment is at a first angle with respect to a line parallel to the propagation path of said acoustic surface waves,
    wherein said third segment is at a second angle with respect to a line perpendicular to the propagation path of said acoustic surface waves,
    wherein said second segment is at a third angle with respect to a line parallel to the propagation path of said acoustic surface waves,
    wherein said fourth segment is at a fourth angle with respect to a line parallel to the propagation path of said acoustic surface waves,
    wherein sad first angle is greater than 0 degrees and less than 90 degrees,
    wherein said second angle is greater than 0 degrees and less than 90 degrees minus said fourth angle,
    wherein said third angle is greater than ten degrees and less than 80 degrees, and
    wherein said fourth angle is greater than 20 degrees and less than 90 degrees.

* * * * *